United States Patent [19]

Pace

[11] Patent Number: 4,843,343

[45] Date of Patent: Jun. 27, 1989

[54] ENHANCED Q CURRENT MODE ACTIVE FILTER

[75] Inventor: Gary L. Pace, Boca Raton, Fla.

[73] Assignee: Motorola, Inc., Schaumburg, Ill.

[21] Appl. No.: 140,454

[22] Filed: Jan. 4, 1988

[51] Int. Cl.[4] .............................................. H03F 3/45
[52] U.S. Cl. ................................... 330/257; 330/294; 330/305; 330/306
[58] Field of Search ............... 330/257, 260, 294, 303, 330/305, 306; 307/520; 340/825.4, 825.48

[56] References Cited

U.S. PATENT DOCUMENTS

| | | | |
|---|---|---|---|
| 3,001,146 | 9/1961 | Knol et al. | 330/302 |
| 3,461,394 | 8/1969 | Ulmer | 330/143 X |
| 3,466,559 | 9/1969 | Ruby | 330/85 X |
| 3,605,032 | 9/1971 | Kerwin | 330/107 |
| 3,792,367 | 2/1974 | Fleischer et al. | 330/98 |
| 3,911,296 | 10/1975 | Davis | 307/297 |
| 3,969,682 | 7/1976 | Rossum | 330/306 X |
| 4,019,147 | 4/1977 | Blomenkamp | 328/167 |
| 4,151,472 | 4/1979 | Watanabe et al. | 340/825.48 X |
| 4,288,754 | 9/1981 | Okada et al. | 330/305 X |
| 4,340,868 | 7/1982 | Pace | 330/294 |
| 4,595,885 | 6/1986 | Prieto et al. | 330/305 X |

OTHER PUBLICATIONS

"Simple Electronically Tunable 2nd-Order Active Filter", Electronic Letters, vol. 13, No. 9, J. B. Grimbleby, Mar. 30, 1977.

Primary Examiner—James B. Mullins
Attorney, Agent, or Firm—Vincent B. Ingrassia; Anthony J. Sarli, Jr.

[57] ABSTRACT

A current mode active filter includes a differential amplifier, having two transistors, and a current mirror, having two transistors, connected into a feedback loop. The phase shift of the loop is controlled by one or two grounded capacitors and bias current sources connected to forward bias the base-emitter junctions of the transistors. The frequency of the filter is controlled by varying the dynamic resistances of the base-emitter junctions with the bias current sources. The current mirror increases loop gain, thereby enhancing the Q of the circuit. Improved dynamic range and large-signal performance can be achieved by the addition of two transistors to the current mirror circuit.

14 Claims, 2 Drawing Sheets

ENHANCED Q CURRENT MODE ACTIVE FILTER

BACKGROUND OF THE INVENTION

This invention relates to the field of current mode active filters and more particularly to active filters utilizing a minimum of components in an IC implementation while providing a relatively high Q and improved dynamic range.

A second order active filter is described in U.S. Pat. No. 4,340,868, issued July 20, 1982, and entitled "Current Mode Biquadratic Active Filter". The active filter in this patent has been completely implemented on an integrated circuit which operates from a supply voltage of 1 volt. The maximum filter Q obtainable from this circuit is limited by finite transistor beta and the maximum capacitor ratio realizable on an IC. The dynamic range of the input and output signals is limited by the non-linear diode voltage-current characteristic at one or both of the main circuit nodes. Input signals with an amplitude greater than several millivolts peak-to-peak can cause amplitude and phase distortion at the filter output. If the input signal level is kept small to eliminate dynamic range problems, then filter performance can be degraded due to poor signal-to-noise ratio.

In some low-frequency filter designs the required filter capacitor sizes are too large to implement on an IC. In this case external discrete components are used and the number of external parts and IC package pin-outs required becomes important in order to minimize product size and cost. In other filter designs, additional external components are needed in order to have the capability to externally program filter frequency.

SUMMARY OF THE INVENTION

It is an object of the present invention to provide a new and improved enhanced Q current mode active filter.

It is a further object of the present invention to provide an enhanced Q current mode active filter with improved dynamic range.

It is a further object of the present invention to provide an enhanced Q current mode active filter in which the Q is substantially increased without affecting the tuning or frequency range.

It is a further object of the present invention to provide an enhanced Q current mode active filter which is adaptable to implementation into pagers as a post detection filter requiring a reduced number of IC package pinouts and external parts.

These and other objects are realized in an enhanced Q current mode active filter including a differential amplifier, a current mirror coupled into a feedback loop with said differential amplifier, input means coupled to the feedback loop, and phase shift control means coupled to the feedback loop for providing a predetermined filtering action on signals supplied to said input means. The active filter is made tunable by including a variable bias means as a portion of the phase shift control means.

BRIEF DESCRIPTION OF THE DRAWINGS

Referring to the drawings.

DETAILED DESCRIPTION OF THE PREFERRED EMBODIMENTS

Figure 1:
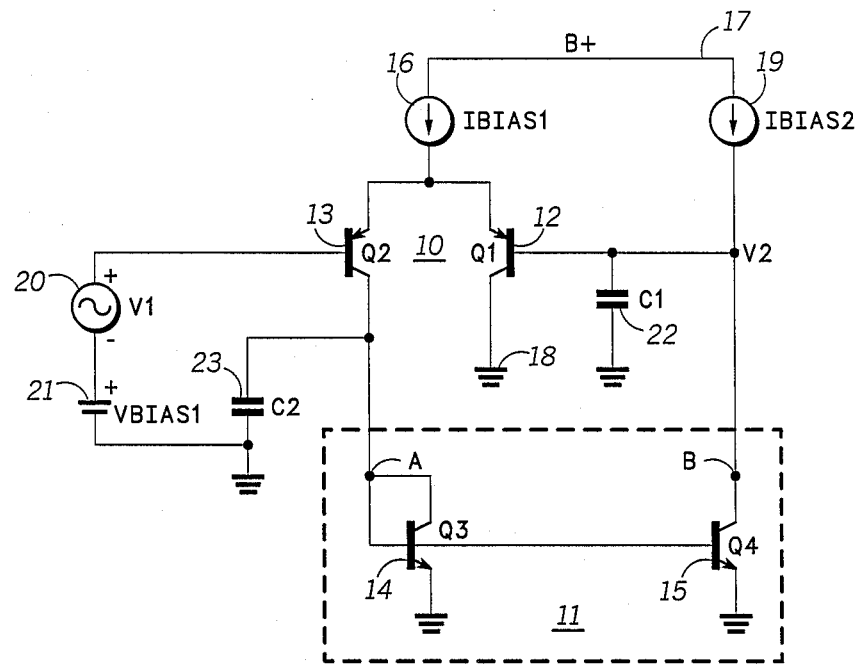
FIG. 1 is a schematic diagram of a second order current mode active filter embodying the present invention.

Referring specifically to FIG. 1, a second order current mode active filter embodying the present invention is illustrated. Basically the filter circuit includes a differential amplifier 10 and a current mirror 11. Differential amplifier 10 includes a first P-N-P type transistor 12 and second P-N-P type transistor 13. Current mirror 11 is shown enclosed by a broken line and includes a first N-P-N type transistor 14 and a second N-P-N type transistor 15. The emitters of transistors 12 and 13 are connected together and through a bias current source 16, which provides $I_{BIAS1}$ current, to a B+ terminal 17 adapted to have a source of voltage applied thereto, which in this example is one volt. The collector of transistor 12 is connected to a reference ground potential 18, which may be any reference such as actual ground, chassis ground, etc. The base of transistor 12 is connected through a second bias current source 19, which provides $I_{BIAS2}$ current, to B+ terminal 17. The base of transistor 13 is adapted to have an input signal applied thereto, represented by signal generator 20 and is further adapted to have a bias voltage source 21 connected thereto. In the circuit illustrated, signal generator 20 and bias voltage source 21 are connected in series between the base of transistor 13 and ground potential 18. It will of course be understood by those skilled in the art that the bias voltage source 21, which provides $V_{BIAS1}$ voltage, can be implemented in a variety of ways, the most common of which is a voltage divider of some well known configuration.

The base and collector of transistor 14 are connected together and further connected to the collector of transistor 13. Also, the base of transistor 14 is connected to the base of transistor 15. The emitters of transistors 14 and 15 are both connected to ground potential 18. The collector of transistor 15 is connected to the base of transistor 12 to complete a feedback loop including transistors 12 and 13 of different amplifier 10 and transistors 14 and 15 of current mirror 11. The collector of transistor 15 also serves as a low pass output for the specific embodiment illustrated. It will be understood by those skilled in the art especially after reviewing U.S. Pat. No. 4,340,868 (cited above), that a variety of outputs and inputs are available with this type of filter circuit. Further, the various connections of the outputs and inputs provide different types of filtering as fully explained in the above identified patent.

A first capacitor 22 is connected from the output terminal, the collector of transistor 15, to ground potential 18. A second capacitor 23 is connected from the base of transistor 14 to ground potential 18. As will be described more completely, a second order filter response is obtained with the presence of both capacitors 22 and 23. However, a first order filter response is obtained if capacitor 23 is eliminated.

The filtering action of the circuit illustrated in FIG. 1 is the result of the feedback loop formed by differential amplifier 10 and current mirror 11 and a controlled phase shift around the feedback loop. The phase shift around the feedback loop is controlled by capacitors 22 and 23 and by the dynamic resistances, hereinafter designated re1 through re4, of the forward biased base emitter junctions of transistors 12 through 15, respectively. The frequency of the filter is tunable over a wide frequency range, independent of filter Q and gain, by varying the DC bias currents supplied by bias sources 16 and 19. The second order filter configuration (both capacitors 22 and 23 connected in the circuit as illustrated in FIG. 1) provides a higher Q than is possible with the circuit in the '868 patent. The enhanced Q performance of the circuit illustrated in FIG. 1 is a result of increased filter loop gain achieved by making the current gain, Ko, of current mirror 11 greater than one. For optimum operation, the DC bias current supplied by bias source 19 should be (Ko/2) times the DC bias current supplied by bias source 16.

Figure 2:
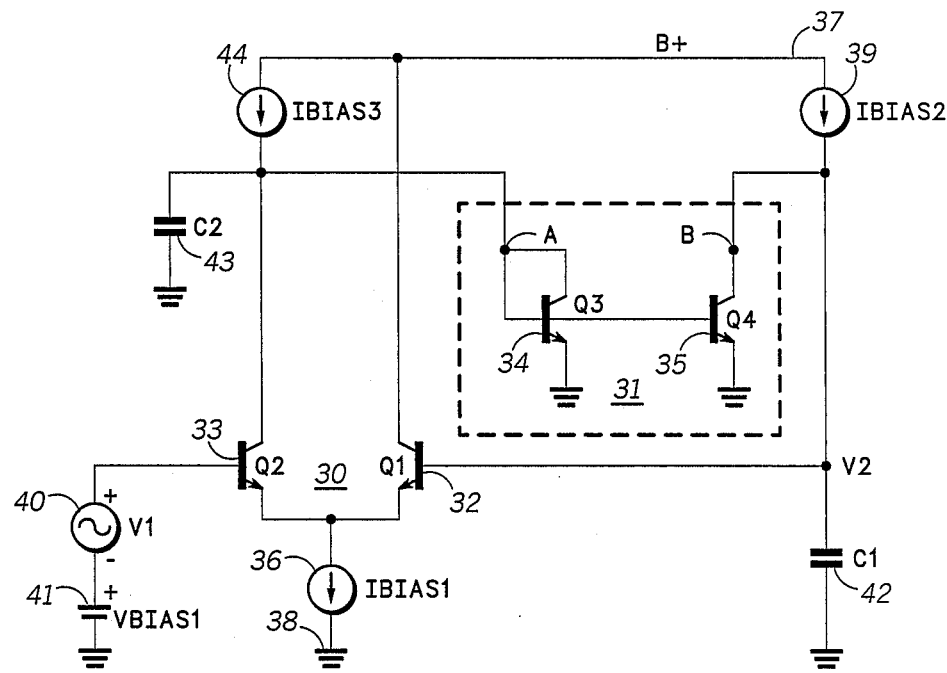
FIG. 2 is a schematic diagram of an alternate second order current mode active filter embodying the present invention.

Referring specifically to FIG. 2, an alternate embodiment of a tunable enhanced Q current mode active filter embodying the present invention is illustrated. The active filter of FIG. 2 includes a differential amplifier 30 and a current mirror 31. Differential amplifier 30 includes two N-P-N type transistors 32 and 33. Current mirror 31, shown enclosed by a broken line, includes two N-P-N type transistors 34 and 35. The emitters of transistors 32 and 33 are connected together and through a bias current source 36, which provides $I_{BIAS1}$ current, to a reference ground potential 38. The collector of transistor 32 is connected directly to a B+ terminal 37 adapted to have applied thereto an appropriate source of voltage, such as a one volt supply. The base of transistor 32 is connected to the collector of transistor 35 and through a bias current source 39, which provides $I_{BIAS2}$ current, to B+ terminal 37. The collector of transistor 35 also serves as the low pass output for the active filter. The base of transistor 33 serves as the input to the active filter, which input is represented by a signal generator 40. Also, a bias voltage supply 41, which provides $V_{BIAS1}$ voltage, is connected in series with the signal generator 40 between the base of transistor 33 and ground potential 38. As in the previous circuit, it will be understood by those skilled in the art that bias supply 41 may actually be implemented in the form of resistive voltage dividers or the like and may not appear electrically in series with the input signal, as illustrated for convenience in the present circuit.

The emitters of transistors 34 and 35 are both connected to reference ground potential 38. The base of transistor 34 is connected to the base of transistor 35. The collector and base of transistor 34 are connected together and to the collector of transistor 33 to complete a feedback loop. Further, the collector of transistor 33 is connected through a third bias current source 44, which provides $I_{BIAS3}$ current, to terminal 37. A first capacitor 42 is connected from the collector of transistor 35 to ground potential 38. A second capacitor 43 is connected from the collector of transistor 33 to ground potential 38. DC bias current source 44 is normally set equal to DC bias current source 36. DC bias current source 39 is normally set equal to (Ko/2) times DC bias current source 36. Basically, the circuit of FIG. 2 is the same as FIG. 1 except that the circuit configuration uses only N-P-N transistors in the signal path and is therefore more compatible with many of the present IC processes. It will of course be understood by those skilled in the art that many other types of semiconductor devices and/or many other combinations of types of transistors may be utilized to construct an active filter embodying the present invention. As in the circuit of FIG. 1, the circuit of FIG. 2 provides second order filter responses and the removal of capacitor 43 changes the filter to provide first order responses. Also, high pass and bandpass filter responses are available by applying the input signals and/or taking the output signals from other points in the circuit, as explained above.

Figure 3:
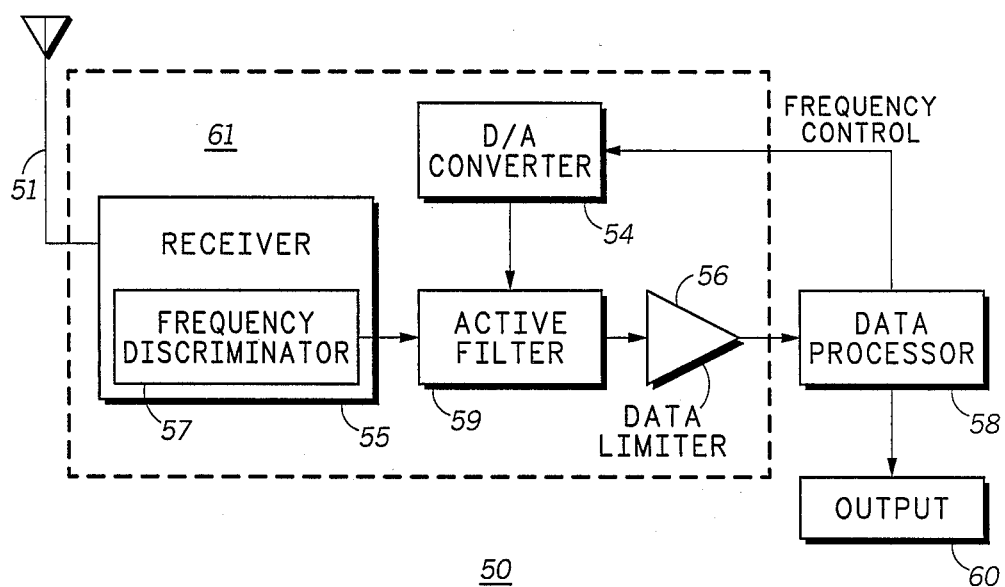
FIG. 3 is a simplified block diagram of a pager with the present filter incorporated therein.

Referring specifically to FIG. 3, a pager 50 is illustrated in simplified block form, which pager 50 includes the novel active filter in a specific embodiment thereof. Pager 50 includes an antenna 51 which may be utilized for reception and, in some pagers, for transmission, a receiver 55 which includes a frequency discriminator 57, an active filter 59, a data limiter 56, a data processor 58 and an output 60, which may be a display or the like. A D/A converter 54 is needed for applications requiring programmable frequency. In general, substantial portions of receiver 55, active filter 59, data limiter 56 and D/A converter 54 are included on an integrated chip 61. The active filter disclosed in either FIG. 1 or 2 or in FIG. 1 or 2 with FIG. 3 modification is especially suited for complete implementation into integrated circuit 61. In some designs with a low data bit rate, external filter capacitors may be required. The current mode active filter of the present invention uses the current controlled dynamic resistances of transistor base-emitter junctions and grounded capacitors to implement a low current filter whose frequency can be trimmed on chip to compensate for IC make tolerances. Because of the grounded capacitors and relatively low number of components and circuit nodes, excess phase shift is minimized and high frequency performance is improved. While pager 50 is illustrated as including only a frequency discriminator 57, it should be understood that all of the predetection amplification, including any RF and IF amplification is included.

In many applications requiring a second order filter a fixed gain amplifier is integrated in the post detection section of the integrated circuit and four external parts (2 resistors, 2 capacitors) are connected to three pins on the integrated circuit to implement a Sallen and Key filter. Because the fixed gain amplifier has a finite output impedance, a fifth external part (a capacitor) may also be required between the filter output and ground. This capacitor is needed to bypass to ground any frequency discriminator IF component which is passed by the Sallen and Key filter feedback network. The novel filter described herein eliminates the need for three of the external parts and requires one less pin on the integrated circuit. Since the capacitor 22 of FIG. 1 and 42 of FIG. 2 is connected between the filter output and ground, any IF component in the frequency discriminator output is more effectively suppressed than in previous filters. In addition, the post detection filter frequency can be programmed by one or more control lines from pager data processor 58 to adapt the receiver to different data bit rates. The D/A converter 54 accepts a digital control signal from data processor 58 and generates bias currents for controlling the frequency of the active filter 59. A single D/A control line from the data processor 58 is sufficient if only 2 post detection filter frequencies are required.

In low data bit rate applications requiring a first order post detection filter with external capacitors, only one capacitor is required.

Figure 4:
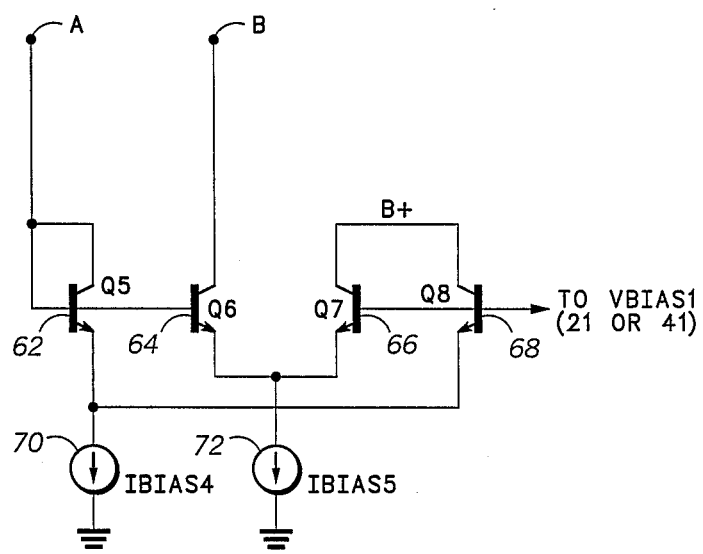
FIG. 4 is a schematic diagram of an alternate current mirror circuit for use in the circuits of FIGS. 1 and 2.

Filter dynamic range can be significantly improved if current mirror 11 in FIG. 1 or current mirror 31 in FIG. 2 is replaced by the current mirror shown in FIG. 4.

The dynamic range of the signal at the input node A of the current mirrors in FIGS. 1 and 2 is limited by the non-linear voltage-current characteristic of the diode connected transistor (14 and 34, respectively). Signal dynamic range is improved by an order of magnitude of approximately 50 millivolts peak-to-peak by using the current mirror circuit in FIG. 4. The alternate current mirror circuit in FIG. 4 includes four N-P-N type transistors 62, 64, 66 and 68. The emitters of transistors 62 and 68 are connected together and through a bias current source 70, which provides $I_{BIAS4}$ current, to ground. The collector and base of transistor 62 are connected together and to the base of transistor 64. Further, the base of transistor 62 is connected to point A which serves as the input to the current mirror. This point A is the same junction shown in FIGS. 1 and 2. The base of transistor 68 is connected to the base of transistor 66 and to a bias voltage supply which may be, for example, supply 21 of FIG. 1 or supply 41 of FIG. 2. The collector of transistor 68 is connected directly to a source of B+. The emitters of transistors 64 and 66 are connected together and through a bias current source 72, which provides $I_{BIAS5}$ current, to ground. The collector of transistor 66 is connected directly to a source of B+. The collector of transistor 64 is connected to point B which serves as the output of the current mirror. This point B is the same junction shown in FIGS. 1 and 2.

The improved dynamic range results from the use of two differential amplifiers connected as shown, and, therefore, has the same wide dynamic range of a differential amplifier. Unlike the filter in the '868 patent, the present invention using the current mirror in FIG. 4 maintains all transistors in the signal path out of voltage saturation. This keeps all transistors in the fully active region, minimizes collector-base capacitance and results in a more predictable filter response. Transistors 66 and 68 can be diode connected transistors with both collectors connected to bias voltage source 21 (FIG. 1) or 41 (FIG. 2) if this voltage source has sufficient current capability. The current gain, Ko, of the current mirror is controlled by the ratio of DC bias current source 72 to DC bias current source 70. Normally, current source 70 would be set equal to current source 16 or 36 (FIG. 1 or FIG. 2). Current source 19 or 39, in FIGS. 1 and 2, should be set equal to one-half the output current of current source 72.

For sufficiently large transistor beta B, $$B >> Ko \quad (1)$$

$$B >> 1/Ko \quad (2)$$

$$B >> Q^2/Ko \quad (3)$$

$$\omega << B/(re4\ C2)$$

$$Ko = re3/re4$$

the second order low pass voltage transfer characteristic of the circuits in FIGS. 1 and 2 is given by:

$$\frac{V2}{V1} = \frac{1/re4(re1 + re2)C1\ C2}{S^2 + S/(re3\ C2) + 1/re4(re1 + re2)C1\ C2} \quad (4)$$

Filter frequency $\omega n$ and Q are given by:

$$\omega n = \sqrt{\frac{Ko}{(re1 + re2)re3\ C1\ C2}}$$

$$Q = \sqrt{\frac{Ko\ re3\ C2}{(re1 + re2)\ C1}} \quad (5)$$

The first order low pass voltage transfer function for the filter circuits in FIGS. 1 and 2 is found by eliminating C2 and modifying Equation (4) accordingly:

$$\frac{V2}{V1} = \frac{Ko/(re1 + re2)C1}{S + Ko/(re1 + re2)C1}$$

$$\omega n = Ko/(re1 + re2)C1$$

re1 through re4 are given by:

$$re1 = \frac{kT}{qIE1}$$

$$re2 = \frac{kT}{qIE2}$$

$$re3 = \frac{kT}{qIE3} \quad \text{(FIGS. 1 and 2)}$$

$$re3 = \frac{4kT}{(q)(I_{BIAS4})} \quad \text{(FIG. 4)}$$

$$re4 = \frac{kT}{qIE4} \quad \text{(FIGS. 1 and 2)}$$

$$re4 = \frac{4kT}{(q)(I_{BAIS5})} \quad \text{(FIG. 4)}$$

k = Boltzmann's constant,

T = temperature in degrees Kelvin, and q = electron charge

Also, IE1, IE2, IE3, and IE4 represent the emitter current flowing in transistors 12, 13, 14, and 15 of FIG. 1, respectively, or transistors 32, 33, 34, and 35 of FIG. 2, respectively (as shown in the FIGS.).

$$IE1 = IE2 = _{BIAS1}/2 \quad \text{(FIGS. 1 and 2)}$$

$$IE3 = I_{BIAS}/2 \quad \text{(FIG.1)}$$

$$IE3 = I_{BAIS3} - (I_{BIAS1}/2) \quad \text{(FIG. 2)}$$

$$IE4 = I_{BIAS2} \quad \text{(FIGS. 1 and 2)}$$

From the above equations, it will be seen that filter frequency $\omega n$ is directly proportional to the DC bias current.

The maximum filter Q of the current mode active filter in the '868 patent is limited by the following requirements on transistor beta:

$$B >> Q^2 \quad (6)$$

$$B >> 1 \quad (7)$$

Assuming a minimum transistor beta of 40, inequalities (1), (2), and (3) show that the above described filter circuit incorporating the present invention with Ko=4 is capable of achieving a stable filter Q of greater than 4, double that of the filter circuit in the '868 patent. Note that the maximum realizable filter Q is determined by equation (5) only if transistor beta is sufficiently large to satisfy inequalities (1), (2) and (3). If these inequalities are not satisfied, a filter Q less than that predicted by equation (5) will result. This analysis assumes that the inequality ">>" is satisfied if the larger term is at least 10 times greater than the smaller term. The enhanced Q performance of the present invention is a result of increased filter loop gain achieved by making the current mirror gain, Ko, greater than 1. The filter circuit in the '868 patent does not have the capability to increase loop gain and thus has a more stringent requirement on minimum transistor beta as specified in inequalities (6) and (7). For many applications, the higher Q capability allows a filter incorporating the present invention to be completely implemented on an integrated circuit using less capacitance and chip area than other 1 volt current mode active filter circuits.

While I have shown and described specific embodiments of the present invention, further modifications and improvements will occur to those skilled in the art. I desire it to be understood, therefore, that this invention is not limited to the particular forms shown and I intend in the appended claims to cover all modifications which do not depart from the spirit and scope of this invention.

What is claimed is:

1. An enhanced Q, current mode active filter comprising:
   a differential amplifier having first and second inputs and a single output;
   a current mirror coupled into a feedback loop wherein the output of the current mirror is connected to the first input of the differential amplifier;
   input means coupled to the second input of the differential amplifier; and
   phase shift control means coupled to the feedback loop for providing a predetermined filtering action on signals supplied to said input means, said phase shift control means comprising:
   bias means coupled to said active filter for biasing said differential amplifier and said current mirror into the predetermined filtering action;
   a first capacitor having a first terminal coupled to the first input of the differential amplifier and a second terminal coupled to a reference potential; and
   a second capacitor having a first terminal coupled to an input of the current mirror and a second terminal coupled to a reference potential.

2. An enhanced Q, current mode active filter as claimed in claim 1 wherein the bias means is a variable bias means for tuning the active filter frequency.

3. An enhanced Q, current mode active filter as claimed in claim 1 wherein the differential amplifier and current mirror each include two semiconductor devices each having a base- emitter junction and the bias means is coupled to forward bias each junction.

4. An enhanced Q, current mode active filter as claimed in claim 3 wherein the bias means includes a variable bias means for controlling phase shift around the feedback loop by controlling dynamic resistances of each of the forward biased base-emitter junctions.

5. An enhanced Q, current mode active filter as claimed in claim 1 wherein the current mirror is constructed to have a current gain greater than 1 in the feedback loop.

6. An enhanced Q, current mode active filter as claimed in claim 1 including in addition a power supply coupled to the differential amplifier and current mirror, said power supply being constructed to supply approximately one volt.

7. Enhanced Q, current mode active filter comprising:
   a differential amplifier having first and second inputs and a single output;
   a current mirror coupled into a feedback loop wherein the output of the current mirror is connected to the first input of the differential amplifier;
   input means coupled to the second input of the differential amplifier; and
   phase shift control means coupled to the feedback loop for providing a predetermined filtering action on signals supplied to said input means;
   wherein the current mirror includes first, second, third and fourth transistors each having base, emitter and collector electrodes, the base of said first transistor being the input of the current mirror and further being connected to the collector of said first transistor and the base of said second transistor, the collector of said second transistor being the output of the current mirror, the collectors of said third and fourth transistors being connected to a voltage supply, and the bases of said third and fourth transistors being connected to a bias voltage source, first and second bias current sources, the emitters of said first and fourth transistors being coupled through said first bias current source to a reference potential and the emitters of said second and third transistors being coupled through said second bias current source to a reference potential.

8. An enhanced Q, current mode active filter comprising:
   a differential amplifier having first and second inputs and a single output including at least two semiconductor devices;
   a current mirror including at least two semiconductor devices coupled into a feedback loop wherein the output of the current mirror is connected to the first input of the differential amplifier;
   input means coupled to the second input of the differential amplifier; and
   phase shift control means coupled to the feedback loop for providing filtering action on signals supplied to said input means, said phase shift control means including bias means coupled to said differential amplifier and said current mirror for forward biasing each of the four semiconductor devices , a first capacitor having a first terminal coupled to the first input of the differential amplifier and a second terminal coupled to a reference potential, and a second capacitor having a first terminal coupled to an input of the current mirror and a second terminal coupled to the reference potential.

9. An enhanced Q, current mode active filter as claimed in claim 8 wherein the four semiconductor devices are all transistors formed in a single integrated circuit.

10. An enhanced Q, current mode active filter as claimed in claim 9 wherein each of the four transistors includes a base-emitter junction and the bias means includes a variable bias means coupled to forward bias each of said base-emitter junctions and control dynamic resistances of each of the forward biased base-emitter junctions in response to variations in said variable bias means.

11. An enhanced Q, current mode active filter comprising:

a differential amplifier including first and second P-N-P- type transistors each having emitter, base and collector electrodes with the emitter electrodes being coupled together, and the collector electrode of the first transistor being coupled to a reference potential;

a current mirror including first and second N-P-N type transistors each having emitter, base and collector electrodes, with the emitter electrodes being coupled to the reference potential, the collector and base electrodes of the first transistor of said current mirror being coupled together and to the collector electrode of the second transistor of said differential amplifier and to the base electrode of the second transistor of said current mirror, and the collector electrode of the second transistor of said current mirror being connected to the base electrode of the first transistor of said differential amplifier;

a first bias current source coupled to the emitter electrodes of the first and second transistors of said differential amplifier;

a second bias current source coupled to the base electrode of the first transistor of said differential amplifier;

a first capacitor having a first terminal coupled to the base electrode of the first transistor of said differential amplifier and a second terminal coupled to the reference potential; and a second capacitor having a first terminal coupled to the base electrode of the first transistor of said current mirror and a second terminal coupled to the reference potential.

12. An enhanced Q, current mode active filter as claimed in claim 11 including in addition a bias voltage source coupled between the base electrode of the second transistor of said differential amplifier and the reference potential.

13. An enhanced Q, current mode active filter comprising:

a differential amplifier including first and second N-P-N type transistors each having emitter, base and collector electrodes, with the emitter electrodes being coupled together and the collector electrode of the first transistor being coupled to a terminal adapted to receive a positive supply voltage;

a current mirror including first and second N-P-N type transistors each having emitter, base and collector electrodes, with the emitter electrodes being coupled to a reference potential, the collector and base electrodes of the first transistor of said current mirror being coupled together and to the collector electrode of the second transistor of said differential amplifier and to the base electrode of the second transistor of said current mirror, and the collector electrode of the second transistor of said current mirror being connected to the base electrode of the first transistor of said differential amplifier;

a first bias current source coupled to the emitter electrodes of the first and second transistors of said differential amplifier;

a second bias current source coupled to the collector electrode of the second transistor of said differential amplifier;

a third bias current source coupled to the collector electrode of the second transistor of said differential amplifier; and a capacitor having a first terminal coupled to the base electrode of the first transistor of said differential amplifier and a second terminal coupled to the reference potential.

14. An enhanced Q, current mode active filter as claimed in claim 13 including in addition a second capacitor having a first terminal coupled to the collector electrode of the second transistor of said differential amplifier and a second terminal coupled to the reference potential.

* * * * *